US006430244B1

(12) United States Patent
Ryu

(10) Patent No.: US 6,430,244 B1
(45) Date of Patent: Aug. 6, 2002

(54) DIGITAL PHASE-LOCKED LOOP APPARATUS WITH ENHANCED PHASE ERROR COMPENSATING CIRCUIT

(75) Inventor: In-Hyo Ryu, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/286,561

(22) Filed: Apr. 5, 1999

(30) Foreign Application Priority Data

Apr. 3, 1998 (KR) .............................................. 98-11895

(51) Int. Cl.$^7$ ................................................. H03D 3/24
(52) U.S. Cl. ........................ 375/376; 375/374; 327/157
(58) Field of Search .............................. 375/371, 373, 375/374, 375, 376; 327/3, 5, 7, 142, 146, 147, 148, 150, 155, 156, 157, 159, 536

(56) References Cited

U.S. PATENT DOCUMENTS

| | | | | |
|---|---|---|---|---|
| 4,814,726 A | * | 3/1989 | Byrd et al. ..................... 327/7 |
| 4,952,889 A | * | 8/1990 | Irwin et al. .................... 331/23 |
| 5,949,264 A | * | 9/1999 | Lo .............................. 327/148 |
| 6,140,853 A | * | 10/2000 | Lo .............................. 327/142 |
| 6,154,096 A | * | 11/2000 | Chien .......................... 327/536 |
| 6,181,210 B1 | * | 1/2001 | Wakayama .................. 327/157 |

* cited by examiner

Primary Examiner—Stephen Chin
Assistant Examiner—Lenny Jiang
(74) Attorney, Agent, or Firm—F. Chau & Associates, LLP

(57) ABSTRACT

The present invention relates to a digital phase-locked loop (PLL) circuit producing an output pulse stream or clock pulses in phase with a reference clock input. The digital PLL circuit consumes reduced power during a phase error compensating operation. The digital PLL circuit of the present invention includes, inter alia, a phase comparator for detecting phase errors of an input signal and a feedback signal; a charge pump for sourcing and/or sinking current in response to control signals based on a phase error detected in the phase comparator; and a sensing circuit for detecting a simultaneous activation of the sourcing and the sinking of the charge pump and for generating a sensing signal corresponding to the simultaneous activation, whereby the phase comparator generates in response to the sensing signal the control signals to inactivate the sourcing and the sinking of the charge pump. The charge pump is also activated in response to the sensing signal. Such features of the digital PLL of the present invention prevent phase errors due to a time delay longer than the "on" time of a charge pump in conventional PLL circuits.

21 Claims, 5 Drawing Sheets

DIGITAL PHASE-LOCKED LOOP APPARATUS WITH ENHANCED PHASE ERROR COMPENSATING CIRCUIT

FIELD OF THE INVENTION

The present invention relates to a phase-locked loop (PLL) and, more particularly to a digital PLL having enhanced phase error compensating circuit to control sourcing and/or sinking current of the digital PLL.

BACKGROUND OF THE INVENTION

A digital PLL generally produces output pulse stream or output clock pulses of which frequencies are related to a reference input frequency. A digital PLL requires a digital phase comparator which produces a direct current (DC) output in proportion to a phase difference between, for example, output clock pulses and reference clock input pulses. The DC output is used to control a frequency of a voltage-controlled oscillator (VCO) of the digital PLL, which generates the output clock pulses. Typically, the phase comparator is combined with a charge pump that acts to set a voltage developed across a loop filter capacitor. When current is pumped into a loop filter capacitor, DC voltage across the capacitor increases. On the contrary, when current is pumped out, the DC voltage decreases. The loop filter capacitor is connected to the VCO to set its frequency.

Such an arrangement, however, has a dead band range in which the VCO changes phase without producing sufficient phase comparator output to activate the up/down charging mechanism of the charge pump. Thus, the VCO dithers within the dead band, and this reduces spectral purity of the VCO output (or oscillator signal).

One way to avoid such a dead band is set forth in *AN ECL/I²L FREQUENCY SYNTHESIZER FOR AM/FM RADIO WITH AN ALIVE ZONE PHASE COMPARATOR*, by Donald R. Preslar and Joseph F. Siwinski, at pages 220–226, IEEE Transactions on Consumer Electronics (August of 1981). This publication shows a conventional digital phase comparator in which a delay element is incorporated in a reset circuit. This results in both up and down charge pumps being "on" for a zero phase error. Such an action ensures that there is no appreciable dead band, so that the comparator has been called an alive zone comparator.

A main problem of the alive zone comparator, however, is that delay time by the delay element must be longer than turn-on time of the charge pump. This time is determined by such variables as temperature, fabrication process, and charge pump output voltage. Accordingly, the delay is normally made longer than the worst case turn on time and this renders the period of time, during which both charge and discharge currents are "on", excessive. This can lead to a phase error when the charge and discharge currents are not exactly equal.

FIG. 1 shows a block diagram of a conventional digital PLL. Terminal 10 provides a stable source of signal as a reference input fi. For example, a crystal controlled oscillator is coupled to the terminal 10, and a frequency divider (not shown) can be interposed therebetween. A phase comparator 11 compares the reference input fi with a feedback signal on line 12 to produce an output on either line 13 which directs a charge pump 15 to source current or line 14 which directs the charge pump 15 to sink current. A capacitor 16 schematically represents a low pass filter which supplies a control voltage to a VCO 17. The PLL 1 generates output signal fo of the VCO 17 through an output terminal 18. A frequency divider 19 is programmed by a digital control word signal 20 determining a division ratio N. Thus, the signal on line 12 is fo/N. The PLL will adjust the VCO 17 until the two inputs to the phase comparator 11 are in phase. A use of the programmable frequency divider 19 enables the PLL to perform a digital control, via the digital control word signal 20, of a frequency of the output signal fo at the terminal 18.

In a conventional digital PLL with a conventional phase comparator, however, there is a dead band at which the VCO output dithers. This results in a low purity spectrum of the output signal fo. To improve the purity spectrum of the output signal fo, thus, a delay element can be used. See IEEE Publication, Preslar and Siwinski, at pp. 220–226. FIG. 2 shows a typical phase comparator with a delay element. A delay element 21 is added to turn off NAND gate 22 which is activated by means of NAND gates 23–28 connected to drive NAND gates 29 and 30. Terminal 31 supplied with a reference input fi is coupled to an input of NAND gate 23, and terminal 32 supplied with a feedback input fb coupled to an input of NAND gate 28. The gate 29 and the gate 30 provide a up control signal UP and a down control signal DOWN to the charge pump, respectively. The delay element 21, which typically comprises four cascaded inverter gates, provides a signal delay between a reset gate 22 and output control gates 29 and 30. The amount of delay of delay element 21 should be adequate to ensure that the charge pump 15 conducts for sourcing and sinking current from filter 16 for an interval after the phase comparator 11 resets. As mentioned above, such a delay is made to exceed a maximum value that the conventional digital PLL needs.

SUMMARY OF THE INVENTION

It is an object of the present invention to provide a digital phase-locked loop circuit with reduced power consumption during a phase error compensating operation.

It is another object of the present invention to provide a digital PLL circuit having a zero dead zone.

To attain the above objects, a digital PLL circuit of the present invention provides a wide range of output frequencies in response to an input signal having an input frequency. The circuit comprises a VCO for producing an output signal having an output frequency in response to a control voltage provided from a loop filter, a frequency divider for dividing the output frequency of the output signal by a divisor to produce a divided output signal having a divided output frequency, and a sensing circuit for preventing a needless delay time of a charge pump.

The present invention will be better understood from the following detailed description of exemplary embodiments thereof taken in conjunction with the accompanying drawings, and its scope will be pointed out in the appended claims.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF PREFERRED EMBODIMENTS

Figure 1:
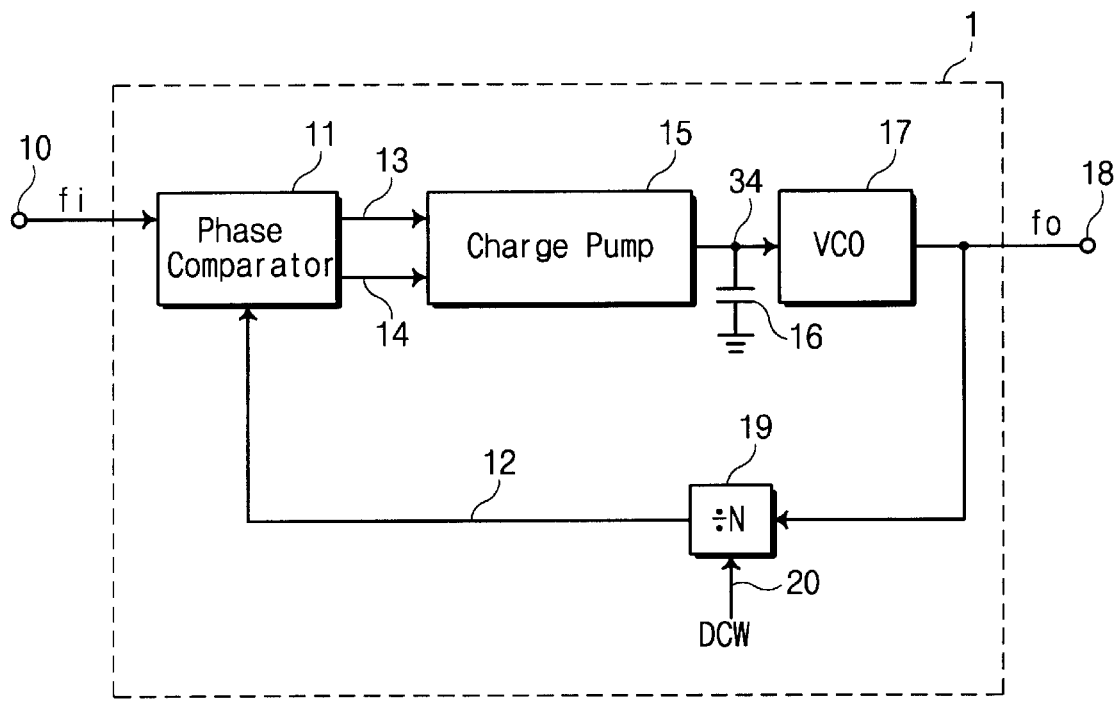
FIG. 1 is a block diagram illustrating a conventional digital PLL circuit.
Figure 2:
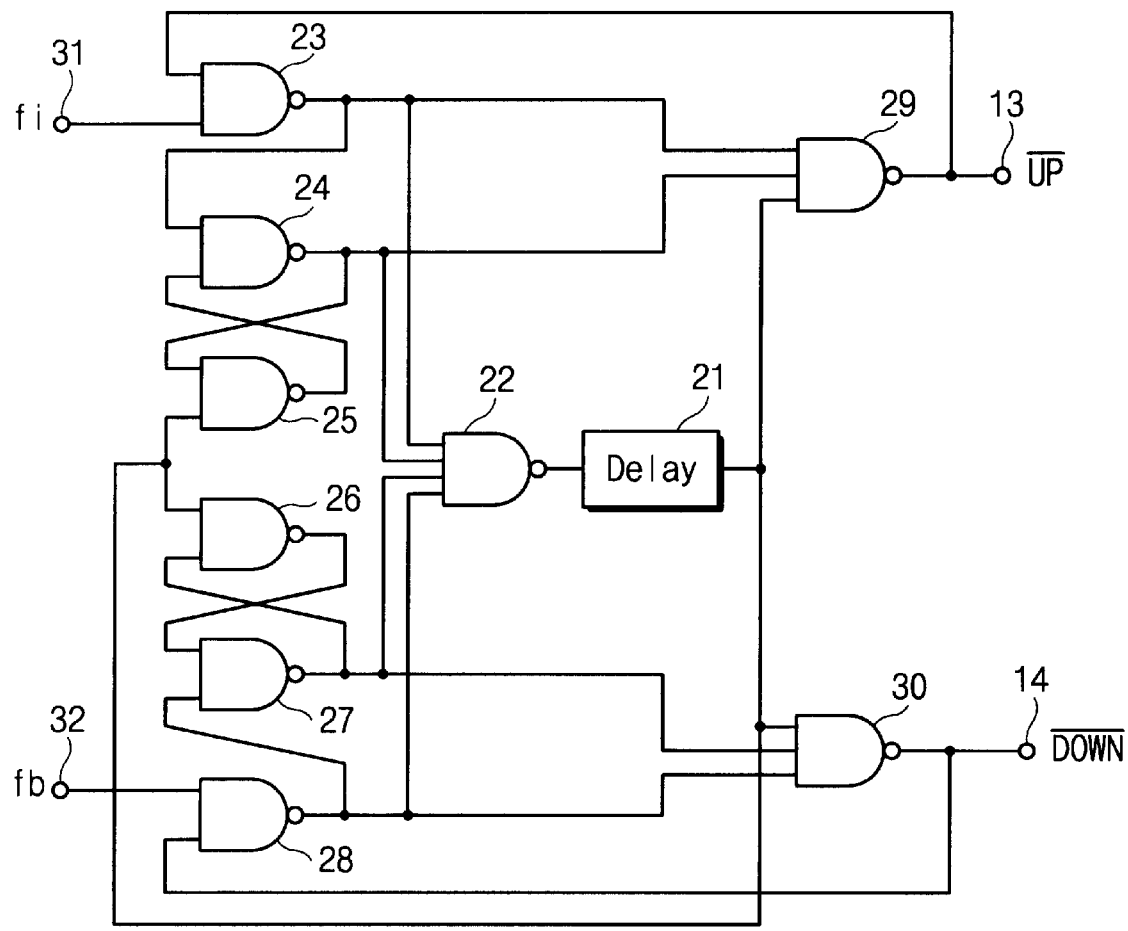
FIG. 2 is a digital schematic diagram illustrating a conventional phase comparator of a digital PLL circuit.
Figure 3:
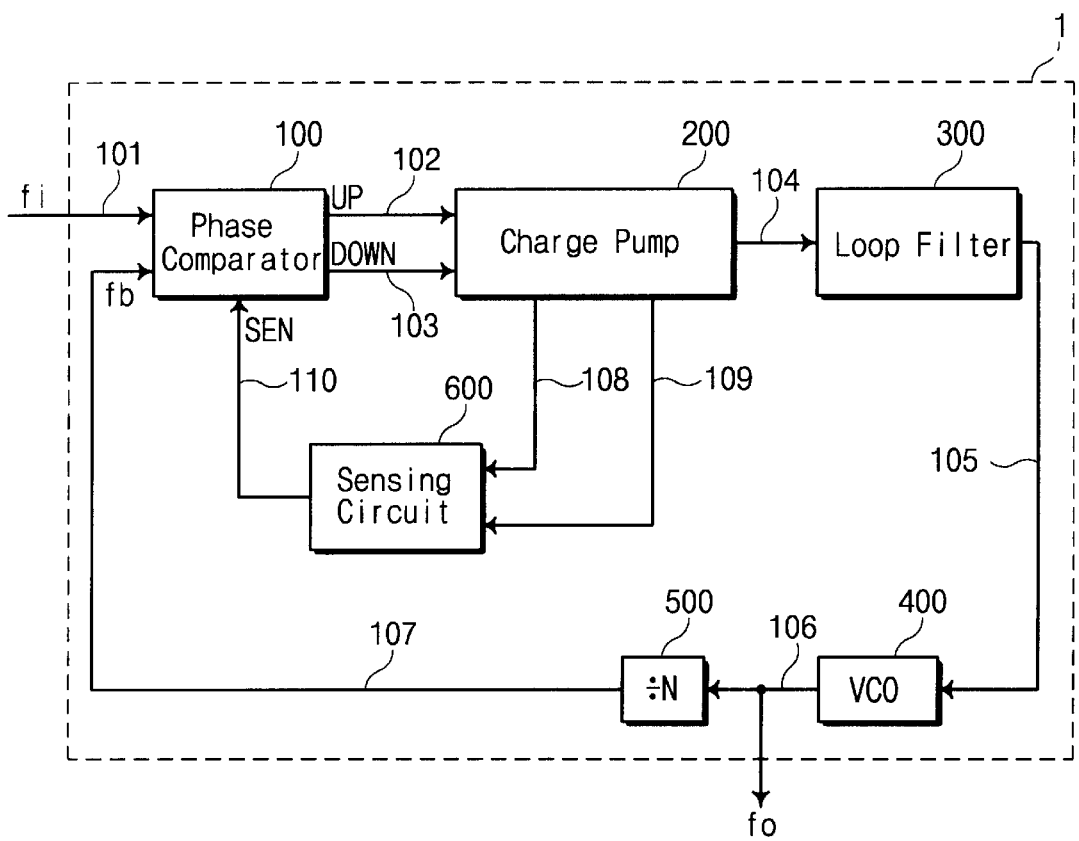
FIG. 3 is a block diagram illustrating a digital PLL circuit according to the present invention.

FIG. 3 is a block diagram illustrating a preferred embodiment of a digital PLL circuit according to the present invention. A digital PLL circuit of the present invention includes, inter alia, a sensing circuit 600 for generating a sensing signal SEN when the sensing circuit 600 detects a simultaneous operation of a current sourcing section 224 and a current sinking section 226 (referring to FIG. 4). The sensing circuit 600 has two input terminals coupled with two output terminals of a charge pump 200 and one output terminal 110 coupled with an input terminal of a phase comparator 100.

Referring to FIG. 3, the digital PLL circuit 1 generates an output signal fo having an output frequency in response to an input signal fi having an input frequency. The output signal fo is divided by a division ratio N in a frequency divider 500. A phase comparator 100 provides "up" and "down" control signals UP and DOWN to a charge pump 200 through lines 102 and 103, respectively. The up and down control signals are generated when the input signal fi is faster than a feedback signal fb (fo/N), or the feedback signal fb is faster than the input signal fi. In other words, when the input and feedback signals fi and fb are not synchronized, the up and down control signals are generated. The charge pump 200 provides a charge pump signal in response to the up and down control signals to a loop filter 300 through a line 104. The charge pump signal is filtered by the loop filter 300. The loop filter 300 is generally a low pass filter. A VCO(voltage controlled oscillator) 400 receives a filtered signal from the loop filter 300 and generates the output signal fo. When the PLL circuit 1 is locked in a phase, the output signal fo is also locked in a certain frequency for locking the phase.

Figure 4:
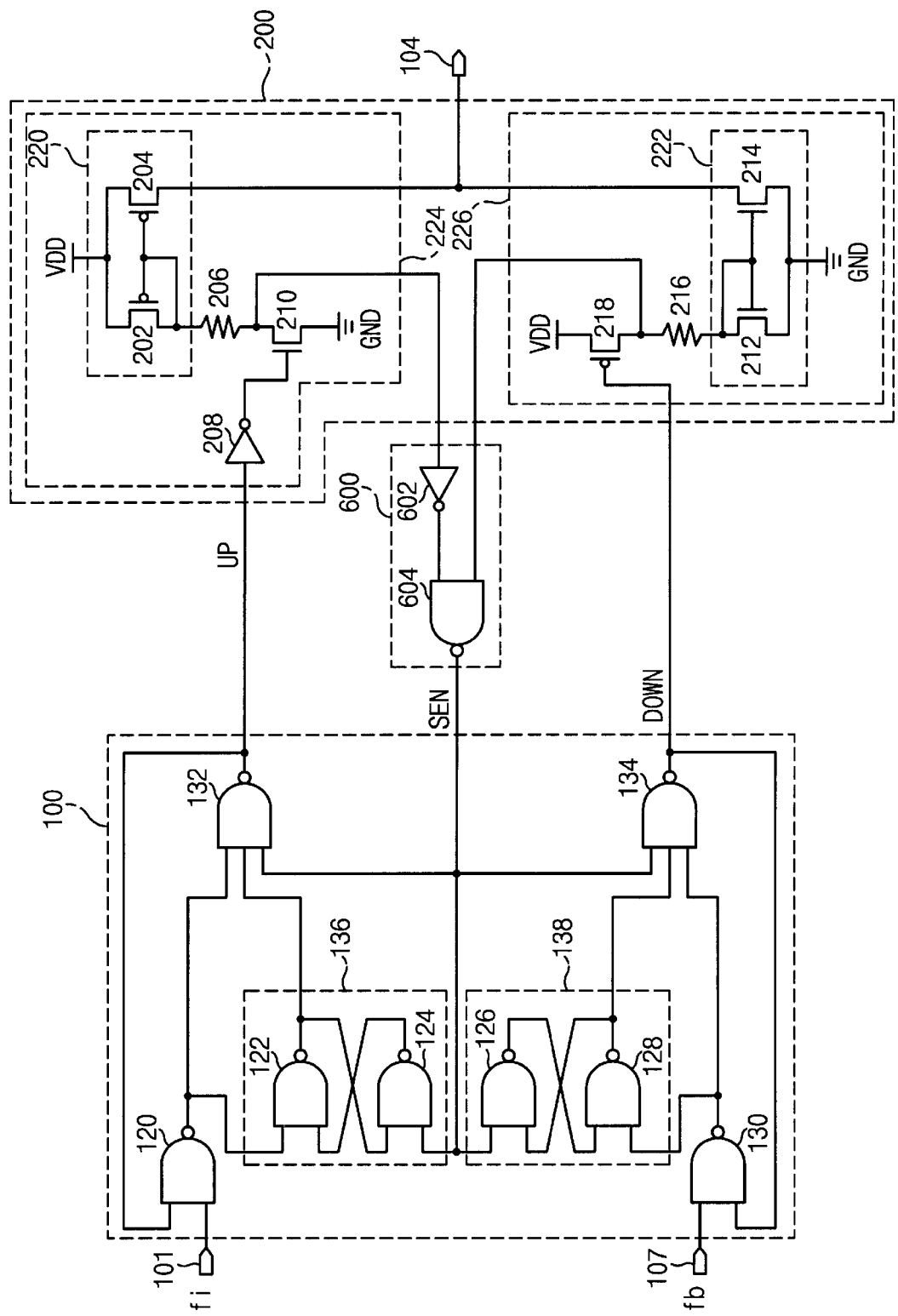
FIG. 4 is a digital schematic diagram illustrating a combination of a phase comparator, a charge pump, and a sensing circuit of the digital PLL circuit in FIG. 3.

FIG. 4 is a digital schematic diagram illustrating a preferred embodiment of a combination of a phase comparator, a charge pump, and a sensing circuit according to the present invention. A phase comparator 100 comprises four NAND gates 120, 130, 132 and 134, and two latches 136 and 138. Each of the latches 136 and 138 comprises two NAND gates 122 and 124, or 126 and 128. The intersecting NAND gates 122 and 126 are connected with other intersecting NAND gates 124 and 128. A charge pump 200 comprises a current sourcing section 224 and a current sinking section 226. The current sourcing section 224 comprises a resistor 206, an inverter 208, an NMOS Transistor 210, and a current mirror 220 which is connected with a power supply VDD. The current mirror 220 comprises two PMOS transistors 202 and 204. Drains of these PMOS transistors 202 and 204 are used as output terminals for supplying current. Also, the current sinking section 226 comprises a resistor 216, a PMOS transistor 218, and a current mirror 222 which is connected to a ground GND. The current mirror 222 comprises two NMOS transistors 212 and 214. Drains of these NMOS transistors 212 and 214 are used as input terminals for sinking current. A sensing circuit 600 comprises an inverter 602 and an NAND gate 604.

FIGS. 5a to 5e are charts illustrating shapes of an input and a feedback signals, up and down control signals, and sinking and sourcing currents of a charge pump.

Figure 5A:
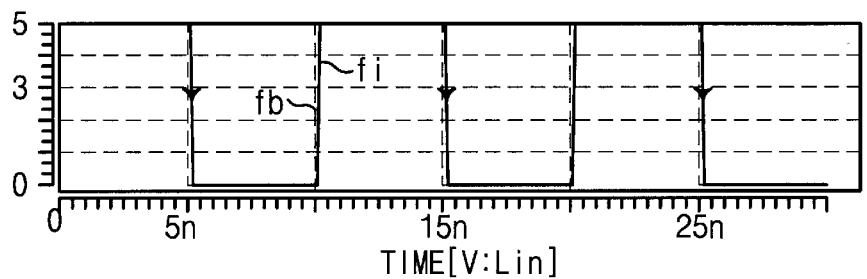
FIGS. 5a to 5e are timing diagrams showing input and feedback signals, up and down control signals, and sourcing and sinking currents in a digital PLL circuit of the present invention.
Figure 5B:
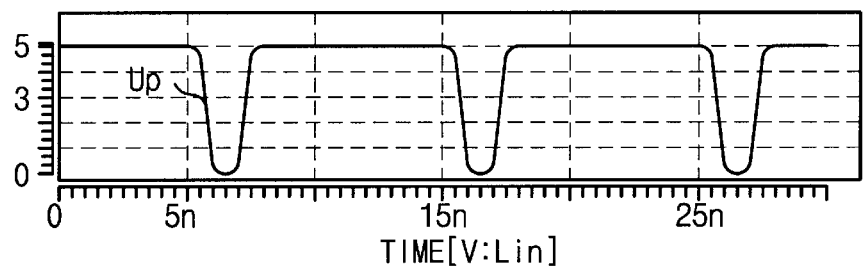
Figure 5C:
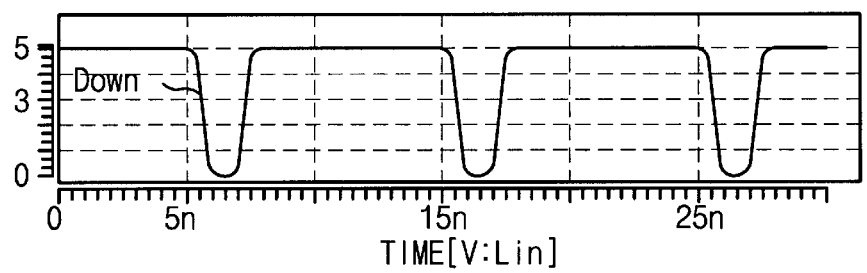

Assuming that the feedback signal fb is faster than the reference input signal fi (as shown in FIG. 5a), operations of the phase comparator 100 and the charge pump 200 (as shown in FIG. 4) are illustrated as follows. The phase comparator 100 keeps a reset state when the reference input signal fi and the feedback signal fb are logic "1". That is, output signals UP and DOWN of NAND gates 132 and 134 and outputs of latches 136 and 138 are logic "1" without an exception. The phase comparator 100 detects a phase error at a certain falling edge of the reference input and feedback signals fi and fb. Since the feedback signal fb is faster than the reference input signal fi, output signal of NAND gate 130 is converted from logic "0" to "1", but NAND gate 120 keeps the reset state, logic "0". As shown in FIG. 5c, the signal DOWN is converted from logic "1" to "0" when the output signal of the NAND gate 130 is converted from logic "0" to "1", wherein output of the latch 138 is logic "0". PMOS transistor 218 is then turned on in response to the down control signal DOWN. Thus, a current mirror 222 of a current sinking section 226 starts sinking current through line 104, and a sensing signal SEN from a sensing circuit 600 keeps the reset state, logic "0".

When the reference input signal fi is converted from logic "1" to "0" after a period of time corresponding to the phase error of the signals fi and fb, the output signal of the NAND gate 120 is converted from logic "0" to "1". As shown in FIG. 5b, then, the up control signal UP from the NAND gate 132 is converted from logic "1" to "0" in response to the output signal of the NAND gate 120. Thus, the NMOS transistor 210 is turned on by the up control signal UP provided through an inverter 208. As a result, a current mirror 220 of a current sourcing section 224 starts sourcing current through the line 104.

At the same time, the sensing circuit 600 detects a simultaneous activation of the current sourcing section 224 and the current sinking section 226 and generates a sensing signal SEN of logic "0". As the sensing signal SEN of logic "0" is supplied to the gates 132 and 134, the up and down control signals UP and DOWN to the charge pump 200 are converted from logic "0" to "1" simultaneously. After being provided with the up and down control signals UP and DOWN of logic "1", the current sourcing section 224 and the current sinking section 226 are inactivated. Thus, the charge pump 200 does not perform the sourcing/sinking of current to/from the signal line 104. When the current sourcing section 224 and the current sinking section 226 are inactivated, the sensing signal SEN is converted from logic "0" to "1". The output signals of the latches 136 and 138 are also converted from logic "1" to "0" and supplied to the gates 132 and 134. The gates 132 and 134 are controlled by the sensing signal SEN before being controlled by the output signals of the latches 136 and 138. When the current sourcing and sinking sections 224 and 226 are simultaneously inactivated, the sensing circuit 600 generates a sensing signal SEN of logic "1". Then, the latches 136 and 138 become reset.

Figure 5D:
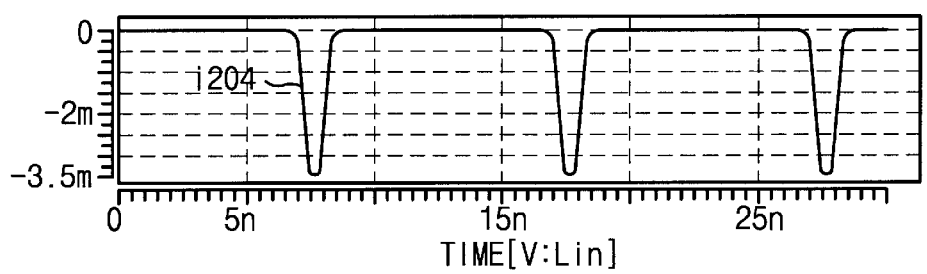
Figure 5E:
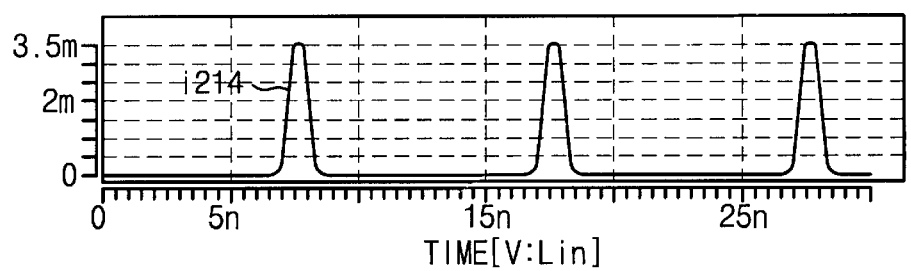

Consuming currents of the PMOS transistor 204 of the current sourcing section 224 and the NMOS transistor 214 of the current sinking section are illustrated in FIGS. 5d and 5e, respectively. In the figures, "i204" and "i214" denote the consuming currents of the transistors 204 and 214, respectively.

In the digital PLL circuit I according to the present invention, therefore, the sourcing/sinking current of the charge pump 200 is supplied to a loop filter 300 and further to a VCO 400, even in case of detecting a small phase error between the reference input signal fi and the feedback signal fb. The sensing circuit 600 of the digital PLL circuit 1 detects the simultaneous operating time of the current sourcing section 224 and the current sinking section 226 and generates the sensing signal SEN. As a result of such features, the charge pump circuit 200 becomes inactive in response to the signal SEN without any needless signal delay.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A phase-locked loop apparatus for receiving an input signal and for generating an output signal in phase with the input signal, the phase-locked loop apparatus comprising:

a phase comparator for receiving the input signal and a feedback signal, and for detecting at least one phase error between the input signal and the feedback signal, whereby the phase comparator generates at least first and second control signals in response to the at least one phase error detected;

a charge pump comprising a sourcing circuit which sources current to an output terminal thereof in response to the first control signal from the phase comparator, and a sinking circuit which sinks current from the output terminal thereof in response to the second control signal from the phase comparator, wherein the sourcing circuit comprises a first current mirror having an input terminal receiving a power supply voltage and at least first and second output terminals, for sourcing current through the first output terminal connecting to the output terminal of the charge pump; and a first switch connected between the phase comparator and the second output terminal of the first current mirror, the first switch being turned on/off in response to the first control signal from the phase comparator, thereby controlling the sourcing of the first current mirror;

a voltage-controlled oscillator for producing the output signal in response to a signal from the output terminal of the charge pump, wherein the output signal of the voltage-controlled oscillator serves as the feedback signal; and a sensing circuit for sensing a simultaneous activation of the sourcing and sinking circuits, and for providing the phase comparator with a sensing signal corresponding to the simultaneous activation, whereby the phase comparator generates in response to the sensing signal the first and the second control signals to inactivate the sourcing and sinking circuits.

2. The phase-locked loop apparatus as defined in claim 1, further comprising a filter connected between the charge pump and the voltage-controlled oscillator, for filtering the signal from the output terminal of the charge pump, and for generating a control voltage signal to control the voltage-controlled oscillator.

3. The phase-locked loop apparatus as defined in claim 1, further comprising a frequency divider connected between the voltage-controlled oscillator and the phase comparator, for dividing a frequency of the output signal from the voltage-controlled oscillator, and for providing the phase comparator with a divided output signal having a divided frequency as the feedback signal.

4. The phase-locked loop apparatus as defined in claim 1, wherein the sourcing and sinking circuits are simultaneously inactivated by the first and the second control signals, respectively, which are generated from the phase comparator when the sensing circuit senses the simultaneous activation of the sourcing and sinking circuits.

5. The phase-locked loop apparatus as defined in claim 1, wherein the phase comparator generates the first control signal to activate the sourcing circuit when the phase comparator detects a falling edge of the input signal.

6. The phase-locked loop apparatus as defined in claim 1, wherein the phase comparator generates the second control signal to activate the sinking circuit when the phase comparator detects a falling edge of the feedback signal.

7. The phase-locked loop apparatus as defined in claim 1, wherein the phase comparator generates the first control signal to inactivate the sourcing circuit when the phase comparator detects an end of a period of the phase error.

8. The phase-locked loop apparatus as defined in claim 1, wherein the phase comparator generates the second control signal to inactivate the sinking circuit when the phase comparator detects an end of a period of the phase error.

9. The phase-locked loop apparatus as defined in claim 1, wherein the sensing circuit has at least first and second input terminals connected to the sourcing circuit and the sinking circuit, respectively, wherein the first input terminal receives a signal representing an activation status of the sourcing circuit, and the second input terminal receives a signal representing an activation status of the sinking circuit.

10. The phase-locked loop apparatus as defined in claim 9, wherein the sensing circuit comprises:

an inverter having an input coupled to the first input terminal of the sensing circuit and an output for generating an inverted signal of the input; and a NAND gate having a first input coupled to the output of the inverter, a second input coupled to the second input terminal of the sensing circuit, and an output for providing the sensing signal to the phase comparator.

11. The phase-locked loop apparatus as defined in claim 1, wherein the first current mirror comprises:

a first transistor having a current path between the power supply voltage and the first output terminal of the first current mirror; and a second transistor having a current path between the power supply voltage and the second output terminal of the first current mirror and a gate commonly connected with the second output terminal of the first current mirror and a gate of the first transistor.

12. The phase-locked loop apparatus as defined in claim 1, wherein the first switch comprises:

an inverter having an input for receiving the first control signal from the phase comparator and an output for generating an inverted signal of the first control signal;

a transistor having a gate connected with the output of the inverter, a current path formed between the second output of the first current mirror and a ground voltage; and a resister connected between the transistor and the second output of the first current mirror.

13. The phase-locked loop apparatus as defined in claim 12, wherein the transistor provides the sensing circuit with a signal representing an activation status of the sourcing circuit.

14. The phase-locked loop apparatus as defined in claim 1, wherein the sinking circuit comprises:
- a second current mirror having a ground terminal and at least first and second input terminals, for sinking current through the first input terminal connecting to the output terminal of the charge pump; and
- a second switch connected between the phase comparator and the second input terminal of the second current mirror, the second switch having an input terminal receiving a power supply voltage and being turned on/off in response to the second control signal from the phase comparator, whereby controlling the sinking of the second current mirror.

15. The phase-locked loop apparatus as defined in claim 14, wherein the second current mirror comprises:
- a first transistor having a current path between the first input terminal of the second current mirror and the ground terminal; and
- a second transistor having a current path between the second input terminal of the second current mirror and the ground terminal, and a gate commonly connected with the second input terminal of the second current mirror and a gate of the first transistor.

16. The phase-locked loop apparatus as defined in claim 14, wherein the second switch comprises:
- a transistor having a current path between the power supply voltage and the second input terminal of the second current mirror and a gate for receiving the second control signal from the phase comparator; and
- a resister connected between the transistor and the second input of the second current mirror.

17. The phase-locked loop apparatus as defined in claim 16, wherein the transistor provides the sending circuit with a signal representing an activation status of the sinking circuit.

18. The phase-locked loop apparatus as defined in claim 1, wherein the phase comparator comprises:
- a first logic circuit for receiving the input signal and the sensing signal from the sensing circuit, and for generating the first control signal to the charge pump;
- a second logic circuit for receiving the feedback signal and the sensing signal from the sensing circuit, and for generating the second control signal to the charge pump;
- a first latch connected between the first logic circuit and the sensing circuit, for being reset in response to the sensing signal from the sensing circuit and for providing the first logic circuit with a signal corresponding to status of the first latch; and
- a second latch connected between the second logic circuit and the sensing circuit, for being reset in response to the sensing signal from the sensing circuit and for providing the second logic circuit with a signal corresponding to status of the second latch.

19. A phase-locked loop apparatus, comprising:
- phase comparator means for detecting a phase error between an input signal and a feedback signal and for generating at least first and second control signals in response to the phase difference between the input signal and the feedback signal;
- souring means for sourcing current in response to the first control signal, the sourcing means including a first current mirror for sourcing current, and a first switch which is turned on/off in response to the first control signal for controlling the sourcing of the first current mirror; and
- sinking means for sinking current in response to the second control signal, the sinking means including a second current mirror for sinking current, and a second switch which is turned on/off in response to the second control signal for controlling the sinking of the second current mirror;
- a filter for filtering signals received from the sourcing and sensing means, and for generating a control voltage signal;
- a voltage-controlled oscillator for producing an output signal in response to the control voltage signal from the filter;
- a frequency divider connected between the voltage-controlled oscillator and the phase comparator means, for dividing a frequency of the output signal from the voltage-controlled oscillator and for providing the phase comparator means with a divided output signal having a divided frequency as the feedback signal; and
- sensing means for sensing a simultaneous activation of the sourcing means and the sinking means, and for providing the phase comparator means with a sensing signal corresponding to the simultaneous activation, whereby the phase comparator means generates in response to the sensing signal the first and the second control signals to inactivate the sourcing circuit and the sinking circuit, respectively.

20. The phase-locked loop apparatus as defined in claim 19, wherein the phase comparator means generates the first control signal to activate the sourcing means when the phase comparator means detects a falling edge of the input signal, and the second control signal to activate the sinking means when the phase comparator means detects a falling edge of the feedback signal.

21. The phase-locked loop apparatus as defined in claim 19, wherein the phase comparator means simultaneously generates the first and the second control signals to inactivate the sourcing means and the sinking means, respectively, when the phase comparator means detects an end of a period of the phase error between the input signal and the feedback signal.

* * * * *